US009496217B2

(12) United States Patent
Tsai et al.

(10) Patent No.: US 9,496,217 B2
(45) Date of Patent: Nov. 15, 2016

(54) METHOD AND APPARATUS OF FORMING A VIA

(75) Inventors: Hsin-Yi Tsai, Hsinchu (TW); Chih-Hao Chen, Hsinchu (TW); Ming-Chung Liang, Hsinchu (TW); Chii-Ping Chen, Taichung (TW); Lai Chien Wen, Hsinchu (TW); Yuh-Jier Mii, Hsin Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 424 days.

(21) Appl. No.: 12/478,619

(22) Filed: Jun. 4, 2009

(65) Prior Publication Data

US 2010/0308469 A1 Dec. 9, 2010

(51) Int. Cl.
*H01L 23/522* (2006.01)
*H01L 21/768* (2006.01)

(52) U.S. Cl.
CPC ...... *H01L 23/5226* (2013.01); *H01L 21/76804* (2013.01); *H01L 21/76811* (2013.01); *H01L 21/76813* (2013.01); *H01L 21/76816* (2013.01); *H01L 2924/0002* (2013.01); *H01L 2924/12044* (2013.01)

(58) Field of Classification Search
CPC ............ H01L 23/5226; H01L 23/528; H01L 21/76802; H01L 21/76804; H01L 21/76816; H01L 23/52; H01L 21/76811; H01L 21/76813
USPC .......................................... 257/774, 775, 758
See application file for complete search history.

(56) References Cited

U.S. PATENT DOCUMENTS

| | | | |
|---|---|---|---|
| 4,070,501 A | | 1/1978 | Corbin et al. |
| 4,758,306 A | * | 7/1988 | Cronin .............. H01L 21/76877 204/192.32 |
| 6,080,654 A | | 6/2000 | Manchester |
| 6,300,683 B1 | * | 10/2001 | Nagasaka et al. ............ 257/774 |
| 6,350,675 B1 | | 2/2002 | Chooi et al. |
| 6,440,753 B1 | | 8/2002 | Ning et al. |

(Continued)

OTHER PUBLICATIONS

"Integration of High Aspect Ration Tapered Silicon Via for Through-Silicon Interconnection", 2008 IEEE.*

(Continued)

*Primary Examiner* — Bilkis Jahan
*Assistant Examiner* — Nga Doan
(74) *Attorney, Agent, or Firm* — Haynes and Boone, LLP

(57) ABSTRACT

The present disclosure provides a semiconductor device that includes, a substrate; a first conductive line located over the substrate and extending along a first axis, the first conductive line having a first length and a first width, the first length being measured along the first axis; a second conductive line located over the first conductive line and extending along a second axis different from the first axis, the second conductive line having a second length and a second width, the second length being measured along the second axis; and a via coupling the first and second conductive lines, the via having an upper surface that contacts the second conductive line and a lower surface that contacts the first conductive line. The via has an approximately straight edge at the upper surface, the straight edge extending along the second axis and being substantially aligned with the second conductive line.

20 Claims, 11 Drawing Sheets

(Top View)

(56) References Cited

U.S. PATENT DOCUMENTS

| 7,989,336 | B2* | 8/2011 | Tang | H01L 21/7682 |
|---|---|---|---|---|
| | | | | 438/294 |
| 2004/0061231 | A1* | 4/2004 | He et al. | 257/758 |
| 2005/0073055 | A1* | 4/2005 | Pan et al. | 257/778 |
| 2007/0278681 | A1* | 12/2007 | Yu et al. | 257/758 |
| 2008/0174027 | A1* | 7/2008 | Fang et al. | 257/774 |
| 2009/0206489 | A1* | 8/2009 | Li et al. | 257/774 |

OTHER PUBLICATIONS

"A Through-Wafer Interconnect in Silicon for RFICs", IEEE, vol. 51, No. 11, Nov. 2004.*

* cited by examiner

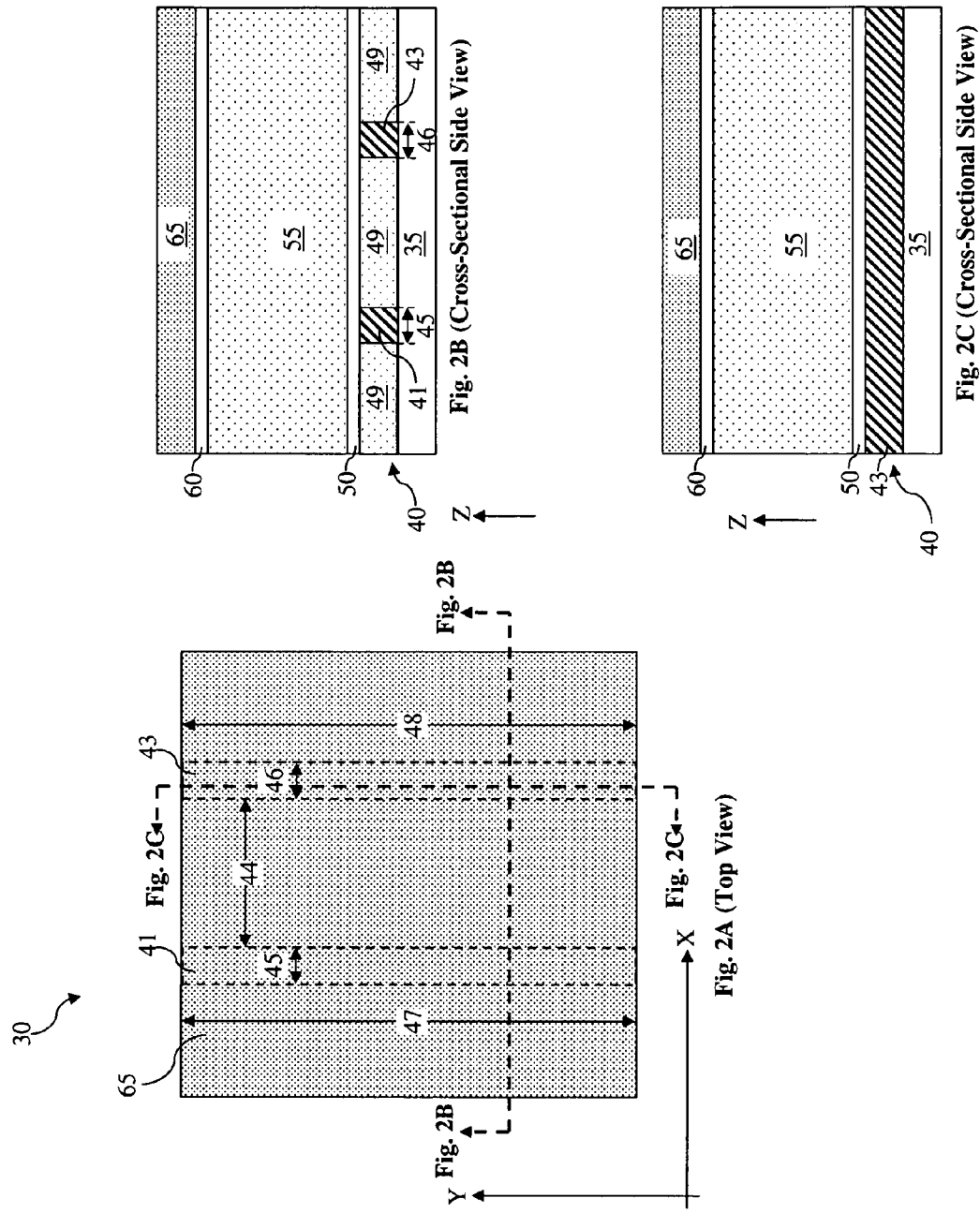

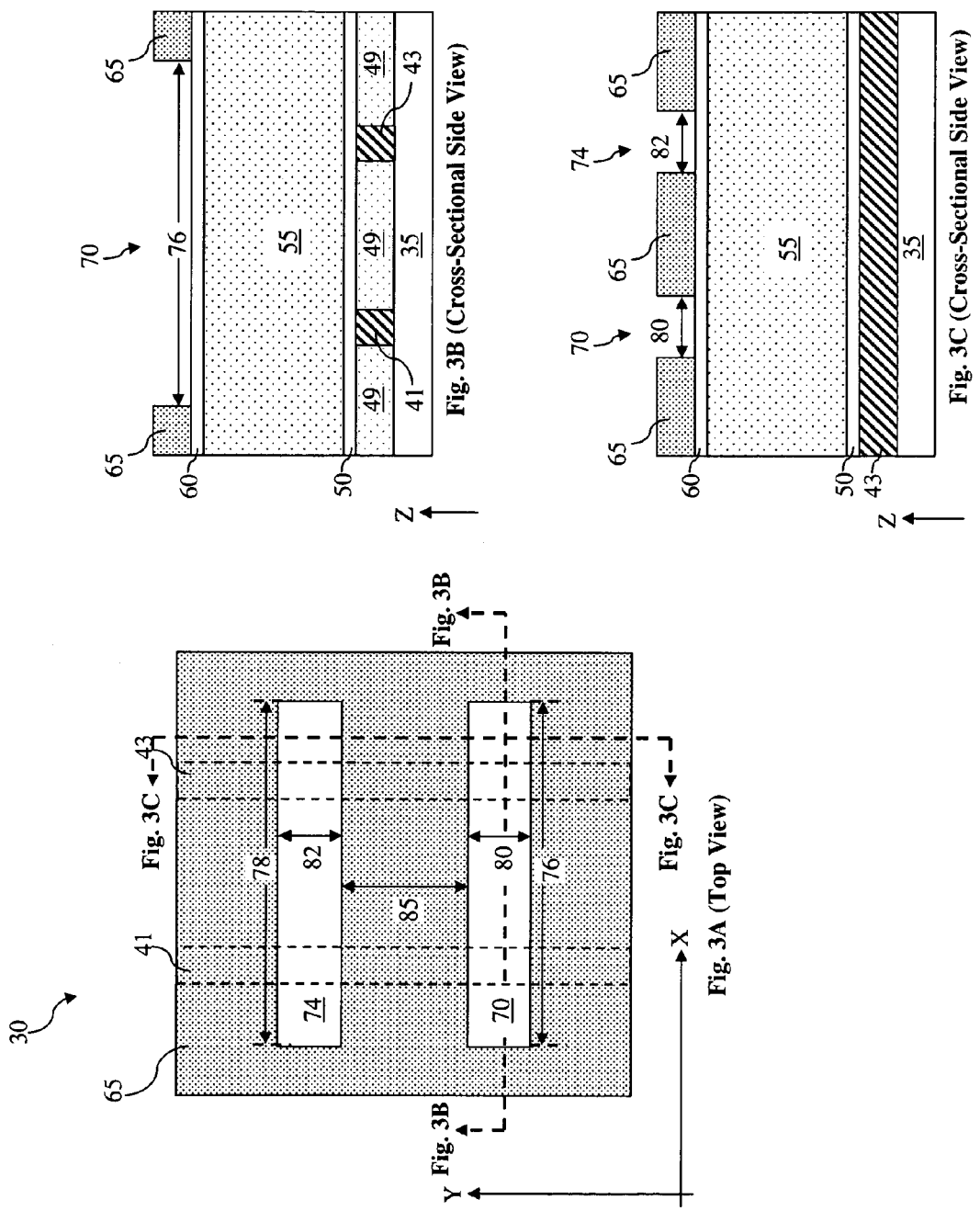

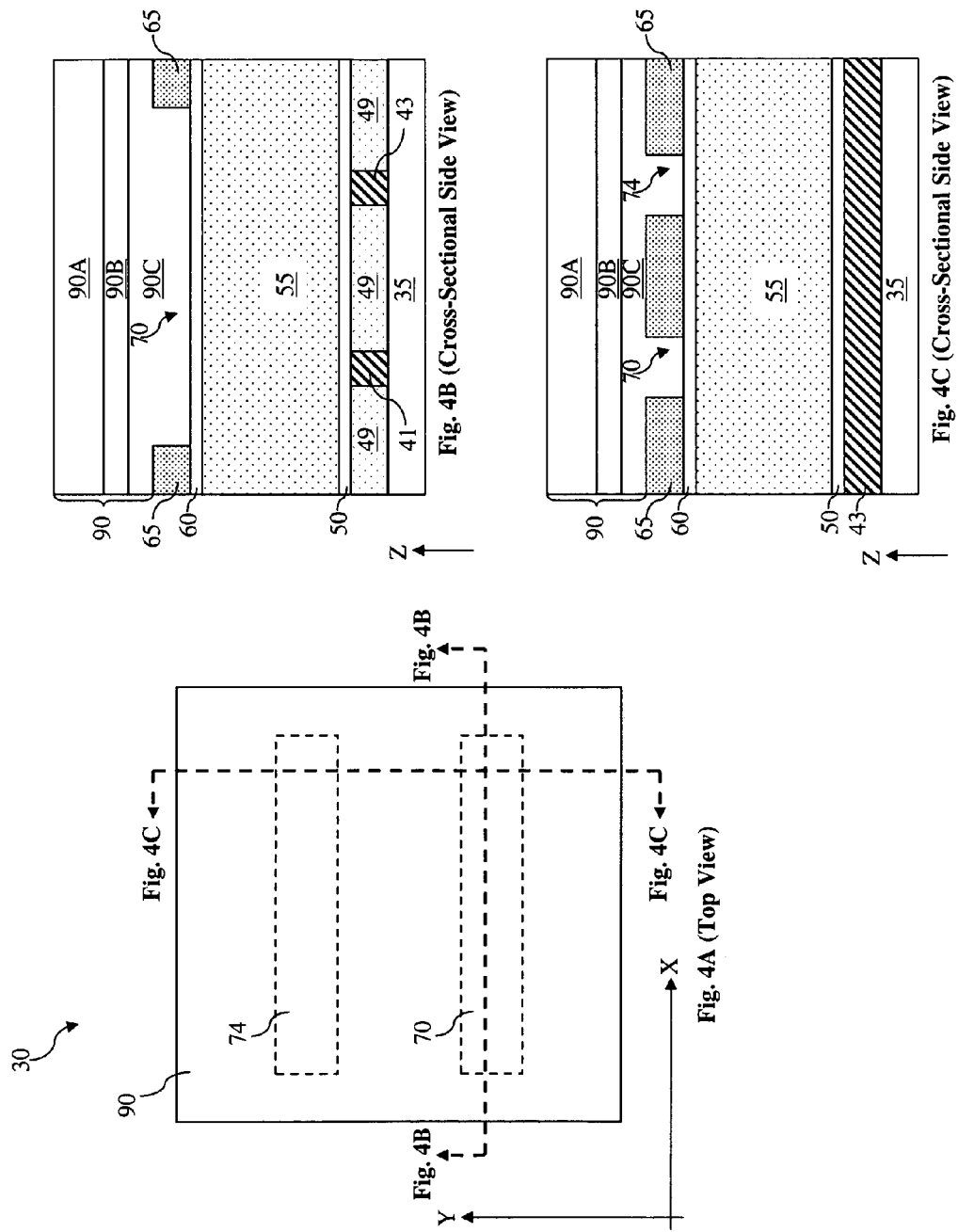

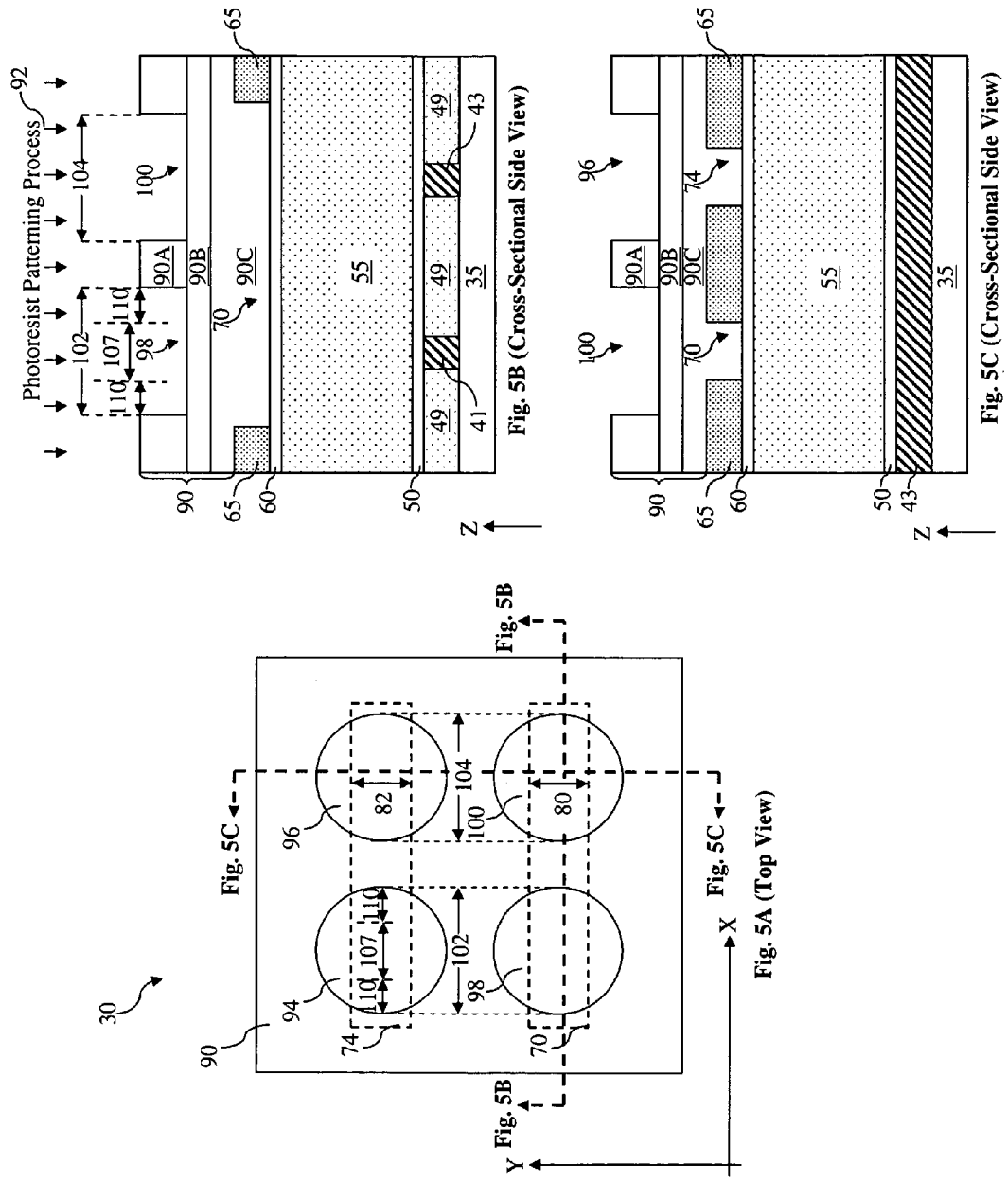

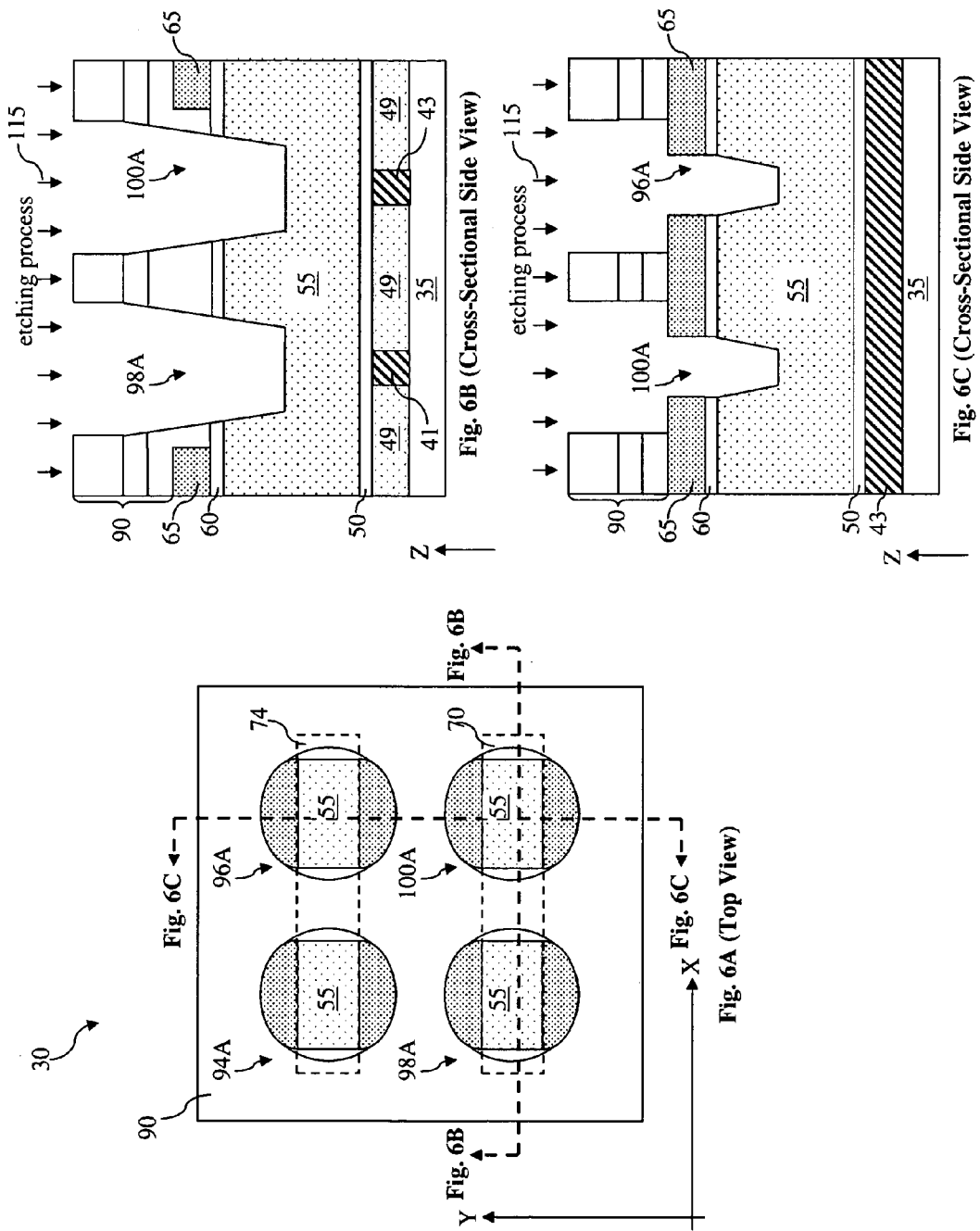

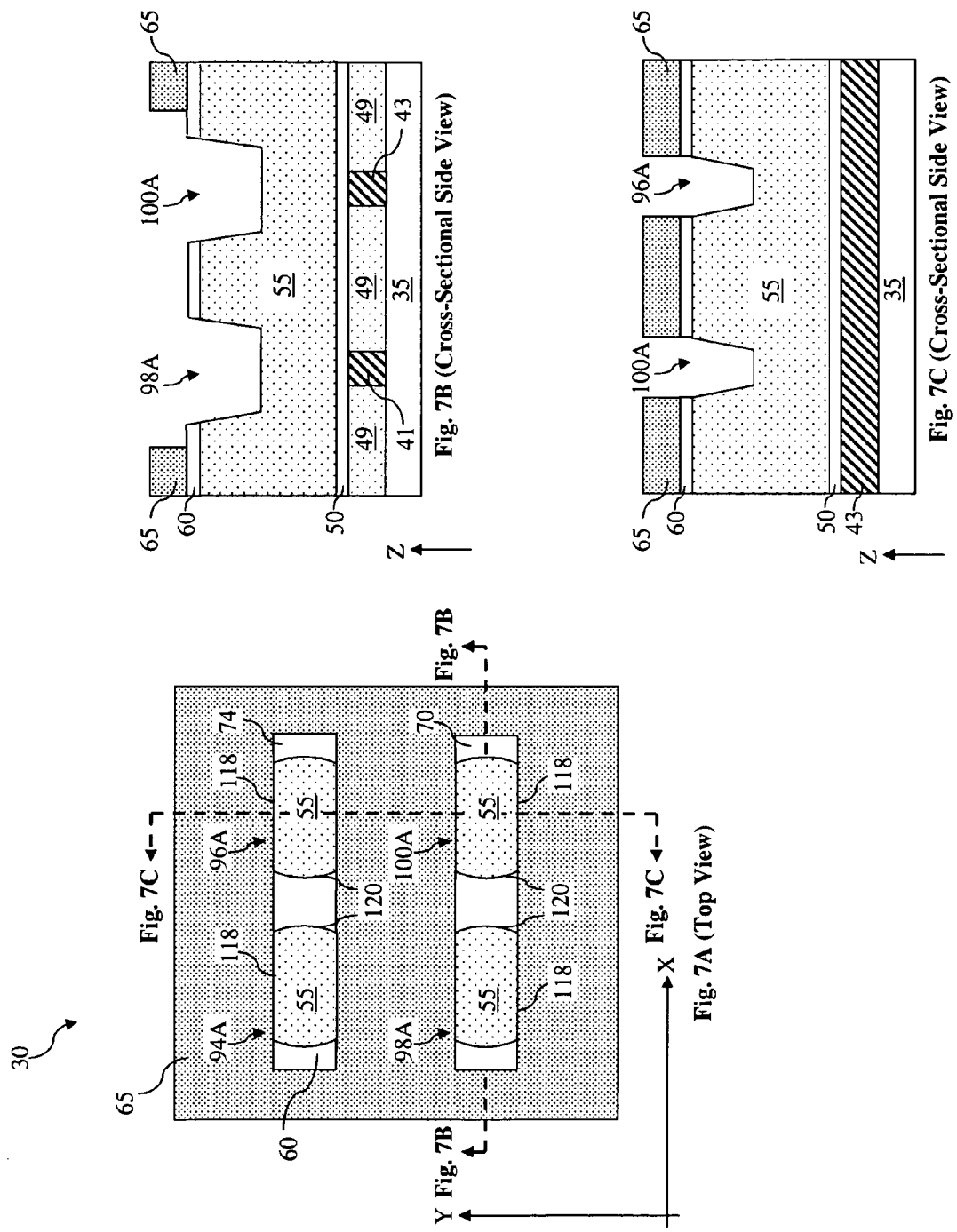

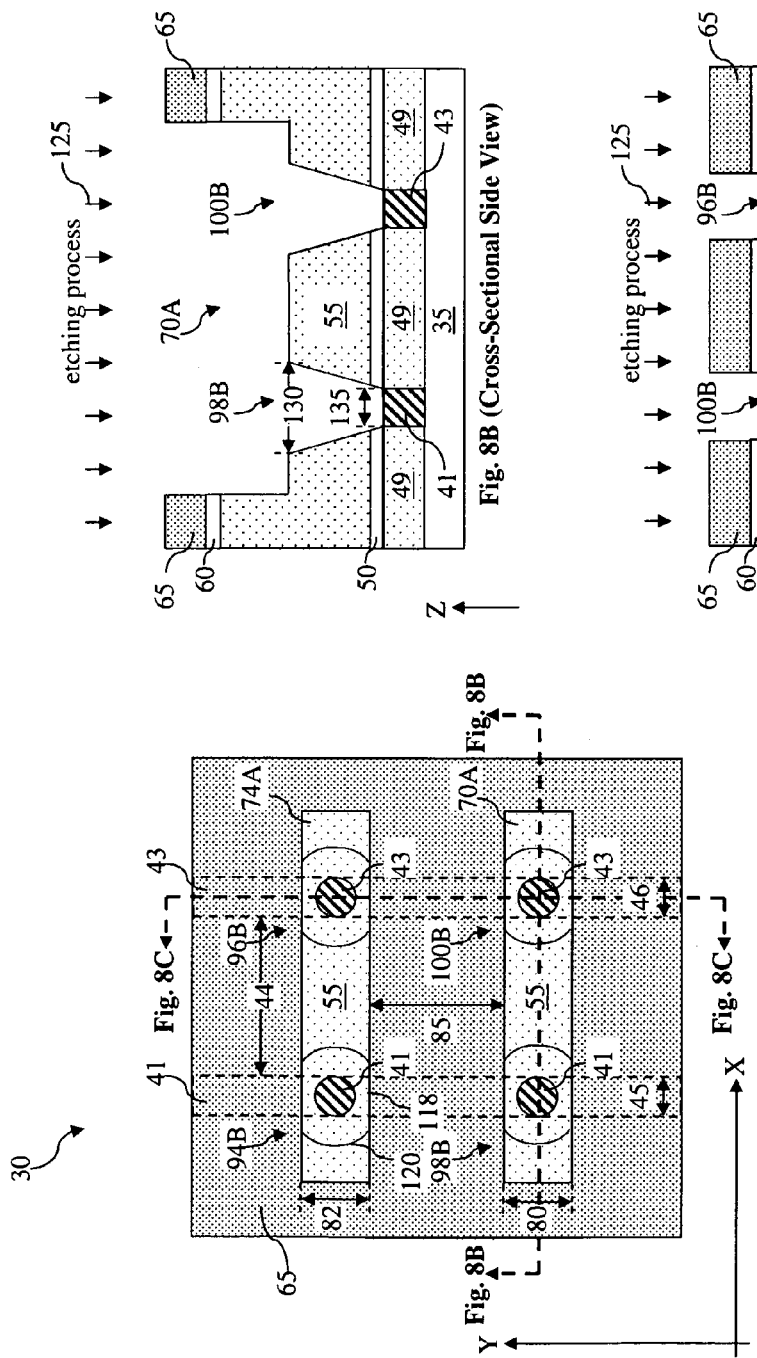

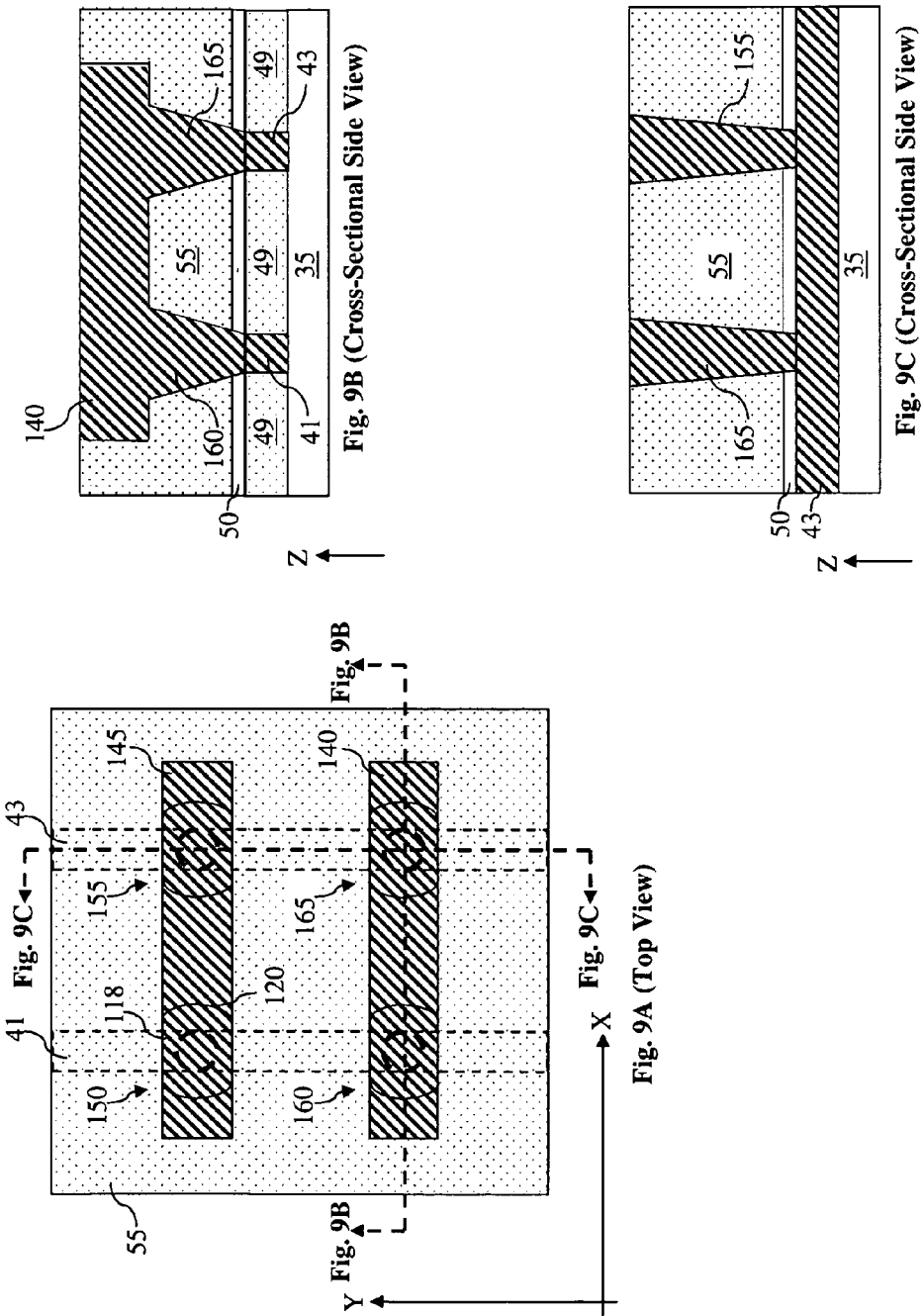

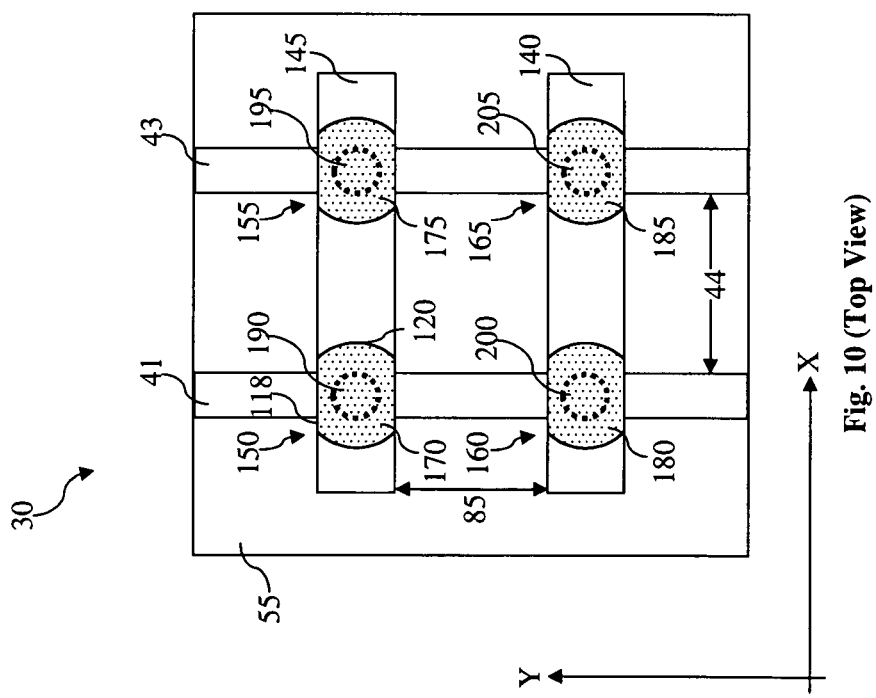
Fig. 10 (Top View)

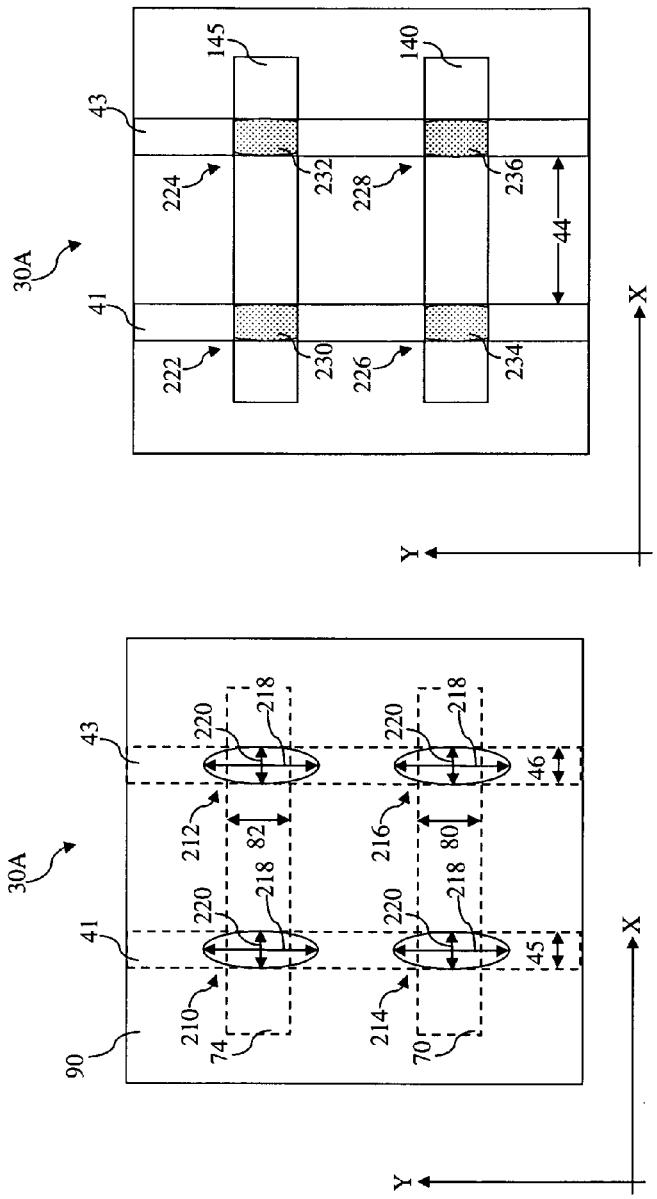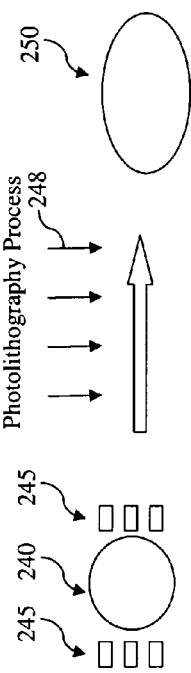

METHOD AND APPARATUS OF FORMING A VIA

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. In correlation with the decrease of geometry size, spacing between various devices on a chip has also shrunk. For example, spacing between metal interconnect lines, known as interconnect spacing size, has been shrinking with each new generation of semiconductor fabrication technology.

Meanwhile, vias are used to provide electrical connections between metal layers. As the interconnect spacing size decreases, it is difficult to produce a via that aligns perfectly with the desired metal interconnect. The lack of perfect alignment may be referred to as an overlay error. If the overlay error becomes great enough, undesired bridging between vias coupled to respective metal interconnect lines on the same metal layer may occur, which causes an electrical short defect. This defect may also be referred to as a via-induced-metal-bridge (VIMB) defect. The VIMB defect is further exacerbated if via sizes are big relative to widths of metal interconnect lines or interconnect spacing sizes. In addition, a time dependent dielectric breakdown (TDDB) problem gets worse as spacing sizes shrink. Current methods of forming vias have difficulties in overcoming these problems mentioned above. Therefore, while existing methods of forming vias have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 9A illustrate top views of a semiconductor device at various stages of fabrication according to the method of FIG. 1;

FIGS. 2B to 9B and FIGS. 2C to 9C illustrate cross-sectional views of a semiconductor device at various stages of fabrication according to the method of FIG. 1;

FIG. 10 is a simplified top level view of a semiconductor device at a stage of fabrication according to the method of FIG. 1;

FIGS. 11A and 11B illustrate top views of a semiconductor device at various stages of fabrication according to an alternative embodiment; and FIG. 11C illustrates one example of an optical proximity correction method.

SUMMARY

Figure 1:
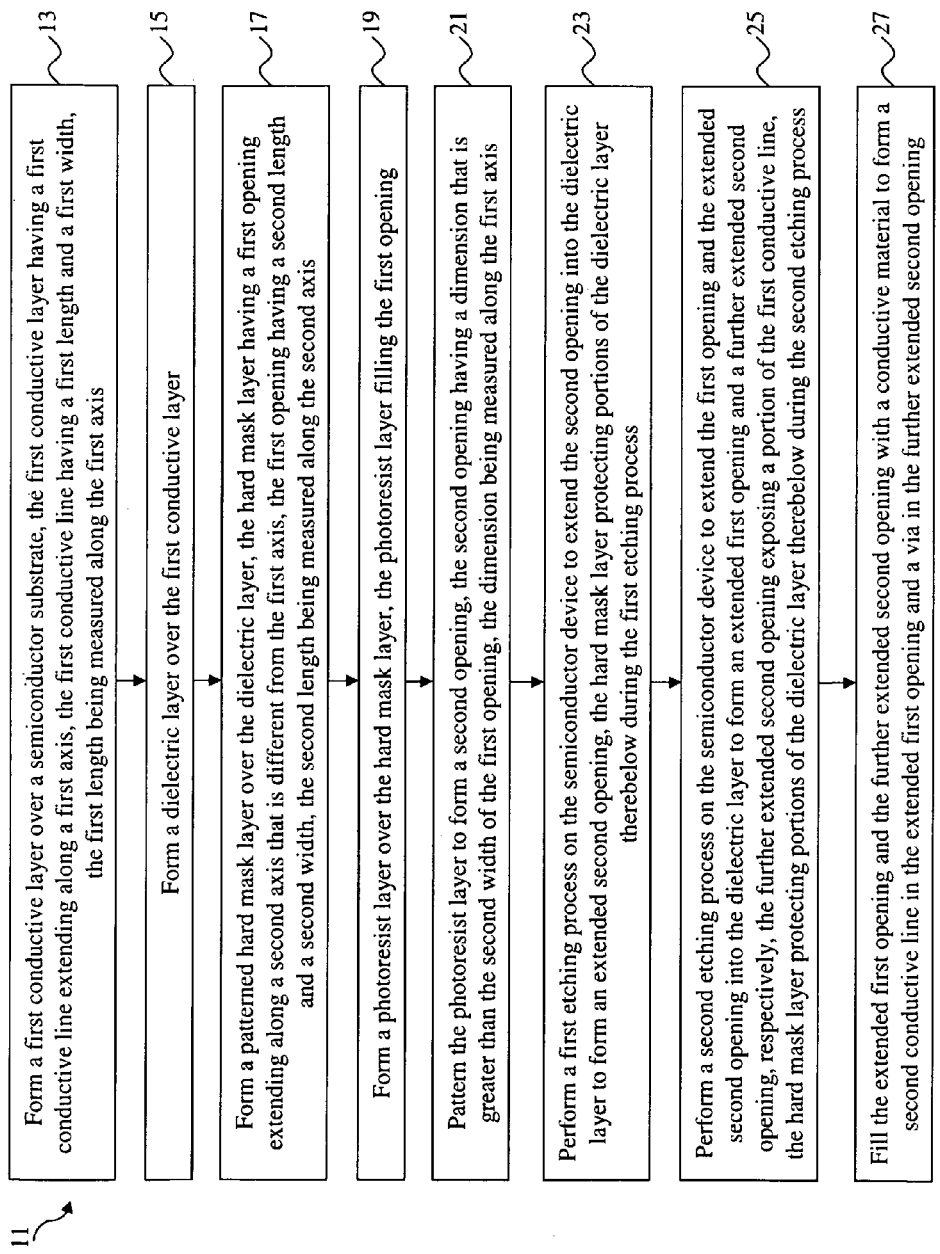
FIG. 1 is a flowchart illustrating a method of forming a via in a semiconductor device according to various aspects of the present disclosure.

One of the broader forms of the present disclosure involves a method of fabricating a semiconductor device. The method includes, providing a semiconductor substrate; forming a first conductive layer over the substrate, the first conductive layer having a first conductive line extending along a first axis, the first conductive line having a first length and a first width, the first length being measured along the first axis; forming a dielectric layer over the first conductive layer; forming a hard mask layer over the dielectric layer; patterning the hard mask layer to form a first opening extending along a second axis that is different from the first axis, the first opening having a second length and a second width, the second length being measured along the second axis; forming a photoresist layer over the hard mask layer, the photoresist layer filling the first opening; patterning the photoresist layer to form a second opening, the second opening having a dimension that is greater than the second width of the first opening, the dimension being measured along the first axis; performing a first etching process on the semiconductor device to extend the second opening into the dielectric layer to form an extended second opening, the hard mask layer protecting portions of the dielectric layer therebelow during the first etching process; removing the photoresist layer; performing a second etching process on the semiconductor device to extend the first opening and the extended second opening into the dielectric layer to form an extended first opening and a further extended second opening, respectively, the further extended second opening exposing a portion of the first conductive line, the hard mask layer protecting portions of the dielectric layer therebelow during the second etching process; and filling the extended first opening and the further extended second opening with a conductive material to form a second conductive line in the extended first opening and a via in the further extended second opening.

Another of the broader forms of the present disclosure involves an apparatus that includes a semiconductor device. The semiconductor device includes, a semiconductor substrate; a first conductive line located over the substrate and extending along a first axis, the first conductive line having a first length and a first width, the first length being measured along the first axis; a second conductive line located over the first conductive layer and extending along a second axis that is different from the first axis, the second conductive line having a second length and a second width, the second length being measured along the second axis; and a via coupling the first and second conductive lines, the via having an upper surface that contacts the second conductive line and a lower surface that contacts the first conductive line, wherein the via has an approximately straight edge at the upper surface, the straight edge extending along the second axis and being substantially aligned with the second conductive line.

Still another of the broader forms of the present disclosure involves an apparatus that includes a semiconductor device. The semiconductor device includes a semiconductor substrate; and an interconnect structure located over the substrate, the interconnect structure having an upper level conductive layer and a lower level conductive layer, an insulating layer separating the upper level and lower level conductive layers, and a non-circular via embedded within the insulating layer; wherein: the upper level and lower level conductive layers include upper level and lower level interconnect lines, respectively, the upper level interconnect line having an orientation that is different from an orientation of the lower level interconnect line; and the via has a long axis and a short axis, the long axis being approximately perpendicular to the upper level interconnect line, the short axis being approximately perpendicular to the lower level interconnect line, the via being coupled to the upper level and lower level interconnect lines.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 11 for forming a via in a semiconductor device. FIGS. 2A-9A are diagrammatic fragmentary top level views of an embodiment of a semiconductor device during various fabrication stages, FIGS. 2B-9B and FIGS. 2C-9C are diagrammatic fragmentary cross-sectional side views, respectively, of the semiconductor device during various fabrication stages. FIG. 10 is a simplified top level view of the semiconductor device at one stage of fabrication. FIGS. 11A-11B are diagrammatic fragmentary top views of another embodiment of a semiconductor device during various fabrication stages. FIG. 11C illustrates an optical proximity correction method. The semiconductor device may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-11 have been simplified for a better understanding of the inventive concepts of the present disclosure. Accordingly, it should be noted that additional processes may be provided before, during, and after the method 11 of FIG. 1, and that some other processes may only be briefly described herein.

Referring to FIG. 1, the method 11 begins with block 13 in which a first conductive layer is formed over a semiconductor substrate. The first conductive layer has a first conductive line extending along a first axis. The first conductive line also has a first length and a first width, the first length being measured along the first axis. The method 11 continues with block 15 in which a dielectric layer is formed over the first conductive layer. The method 11 continues with block 17 in which a patterned hard mask layer is formed over the dielectric layer. The hard mask layer has a first opening extending along a second axis that is different from the first axis. The first opening has a second length and a second width, the second length being measured along the second axis. The method 11 continues with block 19 in which a photoresist layer is formed over the hard mask layer. The photoresist layer fills the first opening. The method 11 continues with block 21 in which the photoresist layer is patterned to form a second opening. The second opening has a dimension that is greater than the second width of the first opening, the dimension being measured along the first axis. The method 11 continues with block 23 in which a first etching process is performed on the semiconductor device to extend the second opening into the dielectric layer to form an extended second opening. The hard mask layer protects portions of the dielectric layer therebelow during the first etching process. The method 11 continues with block 25 in which a second etching process is performed on the semiconductor device to extend the first opening and the extended second opening into the dielectric layer to form an extended first opening and a further extended second opening, respectively. The further extended second opening exposes a portion of the first conductive line. The hard mask layer protects portions of the dielectric layer therebelow during the second etching process. The method 11 continues with block 27 in which the extended first opening and the further extended second opening are filled with a conductive material to form a second conductive line in the extended first opening and a via in the further extended second opening.

Referring to FIGS. 2A-2C, FIG. 2A illustrates a diagrammatic fragmentary top level view of a semiconductor device 30, FIG. 2B illustrates a diagrammatic fragmentary cross-sectional side view of the semiconductor device 30 observed in a direction that is along a Y axis (shown in FIG. 2A), and FIG. 2C illustrates a diagrammatic fragmentary cross-sectional side view of the semiconductor device 30 observed in a direction that is along an X axis (shown in FIG. 2A). The various forming and etching processes (will be discussed later) performed on the semiconductor device are done along a Z axis (shown in FIGS. 2B and 2C) that is perpendicular to an imaginary plane formed by the X axis and the Y axis. The semiconductor device 30 includes a substrate 35. The substrate 35 may be a semiconductor wafer. For example, the substrate 35 may include silicon. The substrate 35 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 35 may include a non-semiconductor material such as a glass substrate for thin-film-transistor liquid crystal display (TFT-LCD) devices, or fused quartz or calcium fluoride for a photomask (mask). The substrate 35 may include various doped regions and/or dielectric features for various microelectronic components, such as a complementary metal-oxide-semiconductor field-effect transistor (CMOSFET), imaging sensor, memory cell, and/or capacitive element.

A conductive layer 40 is formed over the substrate 35. The conductive layer 40 is a part of an interconnect structure that is located over the substrate 35. The interconnect structure is not fully formed at this stage of fabrication and therefore is not illustrated. The conductive layer 40 includes interconnect lines that provide electrical connections between microelectronic components within the semiconductor device 30. In one embodiment, the conductive layer 40 includes aluminum interconnect lines that have a conductive material such as aluminum, aluminum/silicon/copper alloy, titanium, titanium nitride, tungsten, polysilicon, metal silicide, or combinations thereof. The conductive layer 40 is formed by a process including physical vapor deposition (PVD) (or sputtering), chemical vapor deposition (CVD), or combinations thereof. In an alternative embodiment, the conductive layer 40 includes copper interconnect lines that have a conductive material such as copper, copper alloy, titanium, titanium nitride, tantalum, tantalum nitride, tungsten, polysilicon, metal silicide, or combinations thereof. The conductive layer 40 is formed by a process including CVD, sputtering, plating, or other suitable processes.

In FIGS. 2A and 2B, two interconnect lines 41 and 43 of the layer 40 are shown for the sake of illustration. In FIG. 2A, the boundaries of the interconnect lines 41 and 43 from the top level view are illustrated as dashed rectangles. A distance 44 separates the two interconnect lines 41 and 43. The distance 44 may also be referred to as an interconnect spacing size. The interconnect lines 41 and 43 have widths 45 and 46, respectively. In an embodiment, the width 45 is approximately equal to the width 46. The interconnect lines 41 and 43 also have lengths 47 and 48, respectively. In embodiments where the lengths 47 and 48 are greater than the widths 45 and 46, it may be said that the interconnect lines 41 and 43 extend along the Y axis, or have an orientation extending along the Y axis.

In FIG. 2B, the interconnect lines 41 and 43 are surrounded by a dielectric material 49. The dielectric material 49 includes a low-k material in an embodiment. The low-k material can be defined as a dielectric material having its dielectric constant less than about 3.9, that of a thermal silicon oxide. The low-k materials may comprise carbon-doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials. The dielectric layer 49 is formed by spin coating in an embodiment. In other embodiments, the dielectric material 49 may include silicon oxide, silicon nitride, fluorosilicate glass (FSG), combinations thereof, or another suitable insulating material, and may be formed by CVD, PVD, ALD, or combinations thereof.

In FIGS. 2B and 2C, an etch-stop layer 50 is then formed over the conductive layer 40. The etch-stop layer 50 may be formed of silicon nitride, silicon oxynitride, and/or other suitable materials. The etch-stop layer 50 is formed by CVD, PVD, ALD, or combinations thereof.

A dielectric layer 55 is then formed over the etch-stop layer 50. In an embodiment, the dielectric layer 55 includes a low-k material as discussed above. The dielectric layer is formed by spin coating. In alternative embodiments, the dielectric layer 55 may include silicon oxide, silicon nitride, or other dielectric materials, and may be formed by CVD, PVD, ALD, or combinations thereof. It is understood that the composition of the etch-stop layer 50 may be selected based upon etching selectivity to the dielectric layer 55.

Referring back to FIGS. 2B-2C, an etch-stop layer 60 is then formed over the dielectric layer 55. The etch-stop layer 60 may be formed of silicon oxide, silicon nitride, silicon oxynitride, and/or other suitable materials. The etch-stop layer 60 is formed by CVD, PVD, ALD, or combinations thereof.

A hard mask layer 65 is then formed over the etch-stop layer 60. In an embodiment, the hard mask layer 65 includes silicon nitride. In alternative embodiments, the hard mask layer 65 may include titanium, titanium nitride, tantalum nitride, tungsten nitride, silicon oxynitride, silicon oxide, and/or other suitable materials. The hard mask layer 65 is formed using methods such as CVD, PVD, or ALD. It is understood that the composition of the etch-stop layer 60 may be selected based upon etching selectivity to the hard mask layer 65.

Referring now to FIGS. 3A-3C, the hard mask layer 65 is patterned to form openings 70 and 74. In an embodiment, the openings 70 and 74 are approximately perpendicular to the interconnect lines 41 and 43 (illustrated as dashed rectangles in FIG. 3A, though they are not directly observable). The openings 70 and 74 have lengths 76 and 78, respectively, and widths 80 and 82, respectively. The lengths 76 and 78 are dimensions of the openings 70 and 74, respectively, measured along the X axis, and the widths 80 and 82 are dimensions of the openings 70 and 74, respectively, measured along the Y axis. In embodiments where the lengths 76 and 78 are greater than the widths 80 and 82, it may be said that the openings 70 and 74 extend along the X axis, or have an orientation along the X axis. In an embodiment, the length 76 is approximately equal to the length 78, and the width 80 is approximately equal to the width 82. The widths 80 and 82 of the openings 70 and 74 are greater than the widths 45 and 46 of the interconnect lines 41 and 43, respectively, in an embodiment. The openings 70 and 74 are separated by a distance 85. The distance 85 may also be referred to as a interconnect spacing size 85. The openings 70 and 74 will be extended downwardly in later processes so that a conductive material may fill the openings 70 and 74 to form interconnect lines, which will be discussed later.

Referring now to FIGS. 4A-4C, a photoresist layer 90 is formed over the hard mask layer 65 and fills the openings 70 and 74. In an embodiment, the photoresist layer 90 is a tri-layer photoresist that includes three layers of photoresist-90A, 90B, and 90C. It is understood, however, that the photoresist layer 90 in other embodiments may be a single layer photoresist. Referring to FIG. 4A, the openings 70 and 74 are not directly observable from the top level view since the openings 70 and 74 are covered by the photoresist 90 at this stage of fabrication. However, boundaries of the openings 70 and 74 are denoted by dashed rectangles for the ease of reference and for the sake of illustration.

Referring now to FIGS. 5A-5C, the photoresist 90 is patterned by a known photolithography process 92 that includes various masking, exposing, baking, and rinsing processes, in order to form openings 94, 96, 98, and 100 that each extend in a direction along the Z axis. The openings 94-100 extend through the layer 90A of the photoresist 90. In an embodiment, the openings 94-100 have approximately circular shapes and have dimensions that are approximately equal to each other. For example, in FIG. 5A, the openings 94 and 98 have a diameter 102, and the openings 96 and 100 have a diameter 104, and the diameter 102 is approximately equal to the diameter 104. A critical dimension of the openings 94-100 may be defined as a widest length of each of the openings 94-100, where the widest length is measured across the openings 94-100 along the X direction. Since the diameters 102 and 104 constitute widest lengths of the openings 94-100, the diameters 102 and 104 may also be referred to as upper level critical dimensions. Also, the openings 70 and 74 are not directly observable from the top level view since the openings 70 and 74 are covered by the photoresist 90 at this stage of fabrication. As is the case in FIG. 4A, boundaries of the openings 70 and 74 are denoted by dashed rectangles for the sake of illustration.

The diameters 102 and 104 of the openings 94, 98 and openings 96, 100, respectively, are greater than the widths 80 and 82 of the openings 70 and 74. In an embodiment, the diameters 102 and 104 are approximately equal to a sum of a lower level critical dimension and two times an overlay spec, where the lower level critical dimension is defined as a widest length of a via (not formed yet and not illustrated, and will be discussed later) measured along the X axis. To illustrate, in FIG. 5B, the diameter 102 of the opening 98 is approximately equal to a sum of a distance 107 and two times a distance 110. In one embodiment, the distance 107 is the lower level critical dimension and measures the widest length of a lower surface of the via, where the lower surface of the via comes into contact with the interconnect lines 41 and 43. In another embodiment, the distance 107 is an upper level critical dimension of the via and measures the width of the via where the via comes into contact with a conductive line that will be formed in the opening 74. The distance 107 in that case is approximately equal to the width 82 of the opening 74 (or width 80 of the opening 70). The upper and lower level critical dimensions will be discussed in more detail later. The distance 110 is the overlay spec, which is dependent upon manufacturing capabilities and is related to predetermined misalignment tolerances and margins during fabrication. The overlay spec 110 is also dependent upon design rules regarding spacing between interconnect lines, such as interconnect lines 41 and 43 (and in some other embodiments, spacing between openings 70 and 74). As an example, the overlay spec 110 for a 45 nm process is about 15 nm. The distances 107 and 110 are also illustrated in the opening 94 of FIG. 5A. The openings 94-100 will be extended in later processes so that a conductive material may eventually fill the openings 94-100 to form vias.

Referring now to FIGS. 6A-6C, an etching process 115 is performed on the semiconductor device 30 so that the openings 94, 96, 98, and 100 extend downwardly along the Z axis (not illustrated but see discussions above) through a portion of the dielectric layer 55 to form extended openings 94A, 96A, 98A, and 100A, respectively. In an embodiment, the etching process 115 is a dry etching process that has etching parameters that can be tuned, such as etchant used (which may be a polymerized chemistry), etching pressure, and Radio-Frequency (RF) bias power. For example, an etching pressure that is greater than 100 mili-Torr (mT) may be used, an RF bias power that is greater than 1000 Watts (W) may be used, and an etchant includes $CHF_3$, $CH_2F_2$, $C_4F_8$, $C_5F_8$, or combinations thereof. The etching parameters are tuned such that the openings 94A-100A have a tapered profile, as illustrated in FIGS. 6B and 6C.

In FIG. 6A, portions of the opening 70 are overlapping with the openings 98A and 100A, and portions of the opening 74 are overlapping with the openings 94A and 96A, and areas of the dielectric layer 55 that are within the overlapped portions of the openings are exposed and observable from the top level view. Also, the portions of the openings 70 and 74 that do not overlap with the openings 94A-100A are not observable from the top view at this stage of fabrication. However, as is done in FIGS. 4A and 5A, boundaries of the openings 70 and 74 are denoted by dashed rectangles in FIG. 6A for the sake of illustration. Within the openings 94A-100A and on either side (along the Y axis) of the exposed portions of the dielectric layer 55, portions of the hard mask layer 65 are exposed by the etching process 115 and are observable from the top level view in FIG. 6A. This is because the hard mask layer 65 protects portions of the dielectric layer 55 therebelow during the etching process 115, as is illustrated in FIG. 6C. In comparison, the etching process 115 removes portions of the dielectric layer 55 that are not protected by the hard mask layer 65 as shown in FIG. 6B. Further, the portions of the hard mask layer 65 as shown in FIG. 6B are not removed by the etching process 115. Therefore, in FIG. 6A, on either side (along the X axis) of the exposed portions of the dielectric layer 55, the hard mask layer 65 is not exposed and is not observable from the top level view at this stage of fabrication.

Referring now to FIGS. 7A-7C, the photoresist 90 is removed by an ashing or stripping process known in the art. At this stage of fabrication, portions of the hard mask layer 65 that are previously covered up by the photoresist 90 are now exposed and observable from the top view in FIG. 7A. Note that at this stage of fabrication, the openings 94A-100A no longer have circular shapes as they did in FIG. 6A, since the circular shapes of the openings 94A-100A exist in the photoresist layer 90, which is removed. Instead, the openings 94A-100A have approximately straight (linear) edges 118 that extend along the X axis and are substantially aligned with the openings 70 and 74. The openings 94A-100A also have approximately curved (non-linear) edges 120 that merge into the straight edges 118.

Referring now to FIGS. 8A-8C, an etching process 125 is performed on the semiconductor device 30 so that the openings 94A, 96A, 98A, and 100A extend in the downward direction along the Z axis through the dielectric layer 55 completely to form further extended openings 94B, 96B, 98B, and 100B, respectively. The etching process 125 also extends the openings 70 and 74 in the downward direction along the Z axis through the dielectric layer 55 to form extended openings 70A and 74A. The tapered profiles of the openings 94B-100B are maintained by tuning various etching parameters of the etching process 125, such as the etchant used, the etching pressure, the RF bias power, or combinations thereof, as is discussed above for the etching process 115 shown in FIGS. 6A-6C. In an embodiment, the openings 94B-100B have approximately equal shapes and dimensions. As is illustrated in FIGS. 8B and 8C, the openings 94B-100B maintain the straight edges 118 that are substantially aligned with the openings 70A and 74A and curved edges 120 that merge into the straight edges 118.

As is illustrated in FIG. 8B, the openings 94B-100B each have a distance 130 at an upper part of the opening and a distance 135 at a lower part of the opening. For the sake of clarity and simplicity, the distances 130 and 135 are shown only for the opening 98B. The distance 130 would have been a diameter of the openings 94B-100B, had the openings 94B-100B maintained their circular shapes instead of being "cut off" or "interrupted" by the hard mask 65A (or by the openings 70A and 74A). Stated differently, the distance 130 is a widest length of the openings 94B-100B measured along the X axis. Also, after the etching process 125 is completed, portions of the interconnect line 41 are exposed by the openings 94B and 98B, and portions of the interconnect line 43 are exposed by the openings 96B and 100B. Regions of the interconnect lines 41 and 43 exposed by the openings 94B-100B have circular shapes, hence the distance 135 is also a diameter of the exposed regions of the interconnect lines 41 and 43. As is illustrated in FIG. 8B, the distance 130 is greater than the diameter 135, hence the openings 94B-100B are tapered. Also, in FIG. 8A, the openings 94B-100B at an upper level (where the distance 130 is measured) are denoted by the straight edges 118 and the curved edges 120, and the openings 94B-100B at a bottom level (where the diameter 135 is measured) are denoted by dashed circular lines. It is understood that, in comparison to the openings 94B-100B, which have tapered profiles, the openings 70A and 74A have straight profiles.

Although most of the interconnect lines 41 and 43 are not observable at this stage of fabrication, their boundaries are denoted by dashed rectangles shown in FIG. 8A for the sake of illustration. Recall from the discussions for FIGS. 2A-2C that the interconnect lines 41 and 43 are separated by the interconnect spacing size 44 and have widths 45 and 46, respectively. Also recall from the discussions for FIGS. 3A-3C that the openings 70A and 74A are separated by the interconnect spacing size 85 and have widths 80 and 82, respectively. A pitch between the interconnect lines 41 and 43 may be defined as a sum of the width 45 (or width 46) and the interconnect spacing size 44, and a pitch between the openings 70A and 74A may be defined as a sum of the width 82 (or width 80) and the interconnect spacing size 85. A minimum pitch may be limited by the photolithography technology used to fabricate the semiconductor device 30. For example, a minimum pitch of a 65 nanometer (nm) process is no less than about 200 nm, and a minimum pitch of a 45 nm process is no less than about 140 nm. In an implementation of an embodiment where the widths 45 and 46 are minimal widths of the interconnect lines 41 and 43, and the widths 80 and 82 are minimal widths of the openings 70A and 74A, and the pitch between the interconnect lines 41 and 43 and the pitch between the openings 70A and 74A are both minimal, the following mathematical relationships are satisfied:

$$0.5 < (\text{diameter } 135/\text{distance } 130) < 1$$

$$0.5 < [\text{diameter } 135/\text{width } 45 \text{ (or width } 46)] < 2$$

$$1 < [\text{distance } 130/\text{width } 45 \text{ (or width } 46)] < 2$$

In an embodiment where the widths 45 and 46 are not minimal widths of the interconnect lines 41 and 43, or the widths 80 and 82 are not minimal widths of the openings 70 and 74, the following mathematical relationship is satisfied:

$$0.5 < (\text{diameter } 135/\text{distance } 130) < 1$$

Referring now to FIGS. 9A-9C, the hard mask layer 65 is removed, and a conductive material is formed to fill the openings 70A-74A and 94B-100B. The hard mask layer 65 may be removed before or after filling the openings with the conductive material. The conductive material may include aluminum, aluminum/silicon/copper alloy, copper, copper alloy, titanium, titanium nitride, tungsten, polysilicon, metal silicide, or combinations thereof. The conductive material is formed by a process including physical vapor deposition (PVD) (or sputtering), chemical vapor deposition (CVD), or combinations thereof. Interconnect lines 140 and 145 are formed by the conductive material filling the openings 70A and 74A, respectively, and vias 150, 155, 160, and 165 are formed by the conductive material filling the openings 94B, 96B, 98B, and 100B, respectively. The vias 150-165 each have a tapered shape with respect to the Z axis, as shown in FIGS. 9B and 9C. The vias 150-165 also have upper level contact surfaces that contact the interconnect lines 145 and 140 and lower level contact surfaces that contact the interconnect lines 41 and 43. In FIG. 9A, the upper level contact surfaces are denoted by the curved edges 120 and the straight edges 118, and the lower level contact surfaces are denoted by the dashed circles. Also, although the interconnect lines 41 and 43 are not observable at this stage of fabrication, the boundaries of the interconnect lines 41 and 43 are denoted by dashed rectangles. The vias 150-165 provide electrical connections between the interconnect lines 140 and 145, which are located above the vias 150-165 along the Z axis, and the interconnect lines 41 and 43, which are located below the vias 150-165 along the Z axis.

Referring now to FIG. 10, a simplified version of the top level view of FIG. 9A is shown. It is understood that an effective area of a via may be defined as an area of the via that is directly contacting an interconnect line. In FIG. 10, the shaded regions represent effective areas 170, 175, 180, and 185 of the vias 150, 155, 160, and 165, respectively, at the upper level contact surfaces between the vias 150-165 and the interconnect lines 140 and 145. The dashed circular regions within the effective via areas 170, 175, 180, and 185 represent effective via areas 190, 195, 200, and 205, respectively, at the lower level contact surfaces between the vias 150-165 and the interconnect lines 41 and 43. The effective via areas 170-185 may also be referred to as upper level effective via areas 170-185, and the effective via areas 190-205 may also be referred to as lower level effective via areas 190-205. The upper level effective via areas 170-185 each have a shape resembling a circular region that is interrupted (or cut off) by a rectangular region, while the lower level effective via areas 190-205 each have a shape resembling a circular region. From FIG. 10, it can be seen that the upper level effective via areas 170-185 have greater sizes than the lower level effective via areas 190-205. Also, the vias 150-165 maintain straight edges 118 that are aligned with the interconnect lines 140 and 145, as well as curved edges 120 that merge into the straight edges 118.

During fabrication of the semiconductor device 30, it may be important to have proper alignment between vias (such as vias 150-175) and the interconnect lines (such as interconnect lines 140, 145 and interconnect lines 41, 43) of different conductive layers that are coupled to the vias. Improper alignment (or improper overlay) may result from a photolithography process used to fabricate the vias, which may be known as overlay errors. Overlay errors may lead to bridging—undesired electrical shorting between devices. For example, referring to FIG. 10, if the via 150 is shifted downwardly along the Y axis, and/or if the via 160 is shifted upwardly along the Y axis, the two vias 150 and 160 may come into contact with each other at the same level of the interconnect lines 145 and 140. This causes electrical shorting between the interconnect lines 145 and 140, which is undesired and may render the semiconductor device 30 defective. Similarly, if the vias 150 and 155 come into contact with each other at the same level of the interconnect lines 41 and 43, then bridging between the interconnect lines 41 and 43 may also occur. Bridging issues become more severe and more problematic as the interconnect spacing size 85 between the interconnect lines 145 and 140 shrinks, and/or as the interconnect spacing size 44 between the interconnect lines 41 and 43 shrinks.

In an embodiment, however, bridging concerns caused by overlay errors are alleviated. At an upper level—the same level as the interconnect lines 145 and 140, a bigger opening is formed so that the vias 150 and 155, for example, have relatively big (relative to a lower level) effective via areas 170 and 175 at the upper level. If the vias 150 and 155 are shifted to the left or right directions along the X axis during fabrication, potential bridging between the vias 150 and 155 at the upper level is not a problem since the interconnect line 145 comes into contact with both of the vias 150 and 155 anyhow. A bigger effective via area 170 and/or 175 also allows the vias 150 and/or 155 to shift upwardly or downwardly along the Y axis and not have the vias 150 and 155 completely "miss" contact with the interconnect lines 145 and 140. This puts less stress on fabrication accuracy with respect to alignment or overlay.

Potential bridging between the vias 150 and 160 at the upper level is also not an issue because the vias 150 and 160 are "interrupted" by a rectangular regions having the shape of the interconnect lines 145 and 140. This "interruption" is due to the hard mask layer 65 protecting portions of the dielectric layer 55 therebelow during the etching processes 115 and 125 (refer to the discussions above for FIGS. 6A-6C and FIGS. 8A-8C). Stated differently, the vias 150-165 are confined by the hard mask layer 65 during fabrication, such that the conductive material of the vias 150-165 do not extend beyond the interconnect lines 145 and 140 along a Y axis but rather self-align with the interconnect lines 145 and 140 during fabrication. At the lower level—the same level as the interconnect lines 41 and 43, the vias 150-165 have smaller effective via areas 190-205, respectively. This is due to the tapered profiles of the vias 150-165. As mentioned above, bridging between the interconnect lines 41 and 43 at the lower level may occur if the vias 150 and 155 move closer toward each other along the X axis. This may be a result of either overlay errors or the vias 150 and 155 having big lower level critical dimensions. As mentioned previously, the lower level critical dimensions for the vias 150 and 155 are diameters of the vias 150 and 155 measured along the X axis, where the vias 150 and 155 come into contact with the interconnect lines 41 and 43, respectively. The upper level critical dimension is the diameter 102 (or diameter 104, refer to FIGS. 5A and 5B) of an opening used to form the via, such as openings 94-100. It is understood that in other embodiments, the vias 150 and 155 may not have circular shapes at the lower surface, and thus the lower level critical dimensions for the vias 150 and 155 may be the longest sizes of the vias 150 and 155 measured along the X axis, regardless of the exact shapes of the vias 150 and 155. In FIG. 10, since the vias 150-165 have smaller effective via areas 190-205 (smaller diameters) at the lower level, the critical dimensions of the vias 150-165 at the lower level are reduced. Therefore, potential bridging between the vias 150 and 155 (or 160 and 165) at the lower level is also more unlikely, which in turn reduces potential shorting defects between the interconnect lines 41 and 43.

Referring now to FIG. 11A, diagrammatic top level view of another embodiment of the semiconductor device 30A is shown. In this embodiment, the processes of forming the vias and the interconnect lines are similar to the processes of the embodiment described above in FIGS. 2-10. Accordingly, similar features in FIGS. 2-10 and 11 are labeled the same for the sake of clarity. Also, for the sake of simplicity, the cross-sectional side views are not illustrated, and only top level views are shown for the present embodiment. One difference is that instead of forming openings 94, 96, 98, and 100 that have a circular shape (which is illustrated in FIG. 5A), non-circular openings 210, 212, 214 and 216 are formed. The openings 210-216 each have a long segment 218 that is approximately perpendicular to the openings 70 and 74, and a short segment 220 that is approximately perpendicular to the interconnect lines 41 and 43. The segments 218 and 220 may also be referred to as a long axis and a short axis, respectively. In some embodiments, the openings 210-216 each have symmetrical shapes, and the segments 218 and 220 may then be referred to as a long axis of symmetry and a short axis of symmetry, respectively. Also, the openings 210-216 are not fabricated to have a tapered profile in the present embodiment and may have a straight profile instead. In an implementation of the present embodiment where the widths 45 and 46 are minimal widths of the interconnect lines 41 and 43, and the widths 80 and 82 are minimal widths of the openings 70 and 74, the following mathematical relationships are satisfied:

$$0.5 < (\text{short segment } 220/\text{long segment } 218) < 1$$

$$0.5 < [\text{short segment } 220/\text{width } 45 \text{ (or width } 46)] < 1.5$$

$$1 < [\text{long segment } 218/\text{width } 80 \text{ (or width } 82)] < 2$$

In an embodiment, the short segment 220 is approximately less or equal to the widths 45 or 46, and the openings 210-216 are oval-shaped.

Referring now to FIG. 11B, a simplified diagrammatic top level view of the semiconductor device 30A is shown. In an embodiment, oval-shaped vias 222, 224, 226, and 228 are formed by filling the openings 210, 212, 214, and 216, respectively, with the conductive material (as discussed above). The vias 222-228 also have the long segment 218 and the short segment 220 (not illustrated) and do not have the tapered profile. The vias 222-228 each have an upper level contact surface that comes into contact with the interconnect lines 140 or 145, and a lower level contact surface that comes into contact with the interconnect lines 41 and 43. The shapes and sizes of the upper level contact surface are approximately the same (or equal to) the shapes and sizes of the lower level contact surface for each of the vias 222-228. In the present embodiment, shaded regions in FIG. 11B represent effective via areas 230, 232, 234, and 236 of the vias 222, 224, 226, and 228, respectively. The effective via areas 230-236 are approximately the same for the top and bottom surfaces of the vias 222-228. The short segment 220 defines the critical dimension of the vias 222-228. In the embodiment shown in FIGS. 11A-11B, the critical dimensions of the vias 222-228 do not exceed the boundaries of the interconnect lines 41 or 43, though it is understood that the critical dimensions of the vias 222-228 may be set to exceed the boundaries of the interconnect lines 41 and 43 in accordance with other considerations. Thus, the embodiment illustrated in FIGS. 2-10 reduce the critical dimensions of the vias 150-165 at the bottom surface by tuning the parameters of the etching processes to form a tapered profile for the vias 150-165, whereas the present embodiment illustrated in FIGS. 11A-11B confine the critical dimensions of the vias 222-228 by the short segment 220.

To form a non-circular via, a photo-mask having a non-circular opening may be designed and used to form the openings 210-216. Alternatively, even if the photo-mask is not designed to be non-circular, a method known as "optical proximity correction", or OPC, may be used to alter the shape of the openings 210-216, and thus the shapes of the vias 210-216. For example, referring to FIG. 11C, a circular opening 240 may be originally designed for a photo-mask. The OPC method may add assistant features 245 on either side of the circular opening 240. After a photolithography process 248 is performed, a pattern 250 that is formed using the photo-mask having the assistant features 245 besides the circular opening may have an oval shape. It is understood that the above illustration is merely an example, and other desired patterns may be formed by changing the assistant features and their geometries. In real world manufacturing, a design house may give a foundry design files that have circular shaped openings, such as the opening 240. The foundry may then use OPC to form a pattern having a desired shape, such as the oval shaped pattern 250 illustrated in FIG. 11C.

It is also understood that the embodiment illustrated in FIGS. 2-10 and the embodiment illustrated in FIG. 11 may be combined into another embodiment, where the vias formed may have non-circular shapes in addition to having tapered profiles.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a semiconductor substrate;
a first conductive line located over the substrate and extending along a first axis, the first conductive line having a first length and a first width, the first length being measured along the first axis;
a second conductive line located over the first conductive line and extending along a second axis that is different from the first axis, the second axis intersecting the first axis, the second conductive line having a second length and a second width, the second length being measured along the second axis, wherein the first conductive line is located between the semiconductor substrate and the second conductive line; and
a via coupling the first and second conductive lines, the via having an upper surface that directly contacts the second conductive line and a lower surface that contacts the first conductive line, wherein the via has an approximately straight edge and an approximately curved edge in a top view at the upper surface, the straight edge and the curved edge being outermost edges of the via the straight edge extending along the second axis and being substantially aligned with the second conductive line;
wherein:
the first axis and the second axis each span in a horizontal plane; and
a body of the via connecting the upper surface and the lower surface extend in a vertical direction.

2. The semiconductor device of claim 1, wherein the curved edge is at the upper surface, the curved edge extending along the first axis and merging into the straight edge.

3. The semiconductor device of claim 1, wherein the via has a tapered profile from the upper surface to the lower surface.

4. The semiconductor device of claim 1, wherein first conductive line is approximately perpendicular to the second conductive line.

5. The semiconductor device of claim 1, wherein the upper surface of the via has a long segment and a short segment, the long segment being perpendicular to the second axis, and the short segment being perpendicular to the first axis.

6. The semiconductor device of claim 5, wherein:
a ratio of the short segment to the long segment is greater than about 0.5 but less than about 1;
a ratio of the short segment to the first width of the first conductive line is greater than about 0.5 but less than about 1.5; and
a ratio of the long segment to the second width of the second conductive line is greater than about 1 but less than about 2.

7. The semiconductor device of claim 1, wherein the lower surface of the via is approximately circular shaped and has an area not exceeding an area of the upper surface.

8. The semiconductor device of claim 7, wherein:
a ratio of a third length of the upper surface of the via to the first width of the first conductive line is greater than about 1 but less than about 2, the third length being measured across the upper surface of the via along the second axis;
a ratio of a diameter of the lower surface of the via to the first width of the first conductive line is greater than about 0.5 but less than about 2; and
a ratio of the third length to the diameter of the lower surface of the via is greater than about 0.5 but less than about 1.

9. A semiconductor device, comprising:
a semiconductor substrate; and
an interconnect structure located over the substrate, the interconnect structure having an upper level conductive layer, a lower level conductive layer that is located between the upper level conductive layer and the substrate, an insulating layer separating the upper level and lower level conductive layers, and a via embedded within the insulating layer;
wherein:
the upper level and lower level conductive layers include upper level and lower level interconnect lines, respectively, the upper level interconnect line having an orientation that is different from and intersects an orientation of the lower level interconnect line, wherein the upper level and lower level interconnect lines each have an elongate profile in a top view;
the via in the top view has a long axis and a short axis, the long axis being approximately perpendicular to the upper level interconnect line, the short axis being approximately perpendicular to the lower level interconnect line, the via being coupled to the upper level and lower level interconnect lines; and
the via has an upper surface that is in physical contact with the upper level interconnect line, the upper surface having a non-circular shape and including at least one linear edge and at least one curved edge in the top view.

10. The semiconductor device of claim 9, wherein the linear edge is substantially aligned with the upper level interconnect line.

11. The semiconductor device of claim 9, wherein:
the upper level interconnect line and the lower level interconnect line have first and second widths, respectively;
a first ratio between a dimension of the short axis and a dimension of the long axis is greater than about 0.5 but less than about 1;
a second ratio between the dimension of the short axis and the second width is greater than about 0.5 but less than about 1.5; and
a third ratio between the dimension of the long axis and the first width is greater than about 1 but less than about 2.

12. The semiconductor device of claim 9, wherein the via has a lower surface, the via having a tapered profile from the upper surface to the lower surface, and wherein the upper level and lower level interconnect lines are substantially perpendicular to each other.

13. The semiconductor device of claim 12, wherein the upper surface has substantially curved first and second edges and substantially straight third and fourth edges, the first and second edges each being joined by the third and fourth edges, and the third and fourth edges each being joined by the first and second edges.

14. The semiconductor device of claim 12, wherein the long axis and the short axis of the via are measured from the upper surface of the via; and wherein the long axis is substantially perpendicular to the short axis.

15. A semiconductor device, comprising:
an elongate first metal line formed in a first metal layer that is disposed over a substrate, the first metal line extending in a first direction;
an elongate second metal line formed in a second metal layer that is disposed over the first metal layer, such that the first metal layer is disposed between the substrate and the second metal layer, the second metal line extending in a second direction that is different from and intersects with the first direction; and
a via coupling the first and second metal lines, the via having a first interface with the first metal line and a second interface with the second metal line;
wherein:
the second interface has opposite first and second boundaries that are each approximately straight, and opposite third and fourth boundaries that are each approximately curved, the first, second, third, and fourth boundaries being outermost boundaries of the second interface;
the via has a tapered cross-sectional profile;
the first direction and the second direction collectively define a horizontal plane; and
the first and second metal lines are coupled by the via in a vertical direction perpendicular to the horizontal plane.

16. The semiconductor device of claim 15, wherein:
the second metal line has substantially straight first and second boundary lines that each extend in the second direction; and
the first and second boundaries of the second interface substantially coincide with the first and second boundary lines of the second metal line.

17. The semiconductor device of claim 15, wherein the second interface has a first dimension measured in the second direction and a second dimension measured in the first direction, the first dimension being greater than the second dimension.

18. The semiconductor device of claim 15, wherein the second interface is larger than the first interface.

19. The semiconductor device of claim 15, wherein the first interface has an approximately round shape, and wherein the first direction is substantially perpendicular to the second direction.

20. The semiconductor device of claim 15, wherein the first and second boundaries are each approximately straight in a top view, and wherein the third and fourth boundaries are approximately curved in the top view, the first and second boundaries each being joined by the third and fourth boundaries.

* * * * *